US006612852B1

(12) United States Patent
Panella

(10) Patent No.: US 6,612,852 B1
(45) Date of Patent: Sep. 2, 2003

(54) CONTACTLESS INTERCONNECTION SYSTEM

(75) Inventor: Augusto P. Panella, Naperville, IL (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 09/548,940

(22) Filed: Apr. 13, 2000

(51) Int. Cl.$^7$ ............................................. H01R 12/00
(52) U.S. Cl. ........................... 439/70; 439/66; 439/950
(58) Field of Search ............................ 439/71, 70, 66, 439/950; 357/68; 361/328

(56) References Cited

U.S. PATENT DOCUMENTS

| | | | |
|---|---|---|---|
| 3,585,368 A | 6/1971 | Nunamaker | 235/61 |
| 3,593,319 A | 7/1971 | Barber | 340/173 |
| 3,604,900 A | 9/1971 | Kalt | 235/61 |

(List continued on next page.)

OTHER PUBLICATIONS

IBM Technical Disclosure Bulletin, Nonmechanical Connection Technique for High Speed, High Density Integrity Circuit Application, Jan., 1968.
IBM Technical Disclosure Bulletin, Cross Talk Coupled Transmission Line Driver, Mar. 1972.
IBM Technical Disclosure Bulletin, Capacative Coupled Connector, Jul., 1975.
EDO Electro–Ceramic Products, Piezoelectric Ceramic Overview & Power Composition Formulation.

Thomas D. Simon and Thomas F. Knight, Jr., M.I.T. Transit Project, Transit Note #57, A Fast Static Gate.
Lipeng Cao and J. Peter Krusius, School of Electrical Engineering, Cornell University, Smart Packages and Interconnect Substrates–Computing Functions Using Signal Line Coupling.
David B. Salzman, Ph.D., Polychip, Inc. and Thomas F. Knight, Jr. Ph.D., MIT Artificial Intelligence Laboratory, Capacitively Coupled Multichip Modules.
Thomas F. Knight, Jr., Ph.D., MIT Artificial Intelligence Laboratory and David B. Salzman, Polychip, Inc., Ph.D., Manufacturability of Capacitively Coupled Multichip Modules.

(List continued on next page.)

Primary Examiner—Tulsidas Patel
(74) Attorney, Agent, or Firm—Thomas D. Paulius; Charles S. Cohen

(57) ABSTRACT

A contactless interconnecting system is provided between a computer chip package and a circuit board. The chip package has a substantially planar lower surface with a pattern of discrete terminal lands. The circuit board has a substantially planar upper surface spaced from and generally parallel to the lower surface of the chip package. A pattern of discrete circuit pads on the upper surface are aligned with the terminal lands. A plurality of discrete interposer members are disposed between the terminal lands and the circuit pads and are in a pattern corresponding to and aligned with the aligned patterns of the terminal lands and circuit pads. The interposer members are preferably of a material having a higher dielectric constant that of the material filling the gaps between interposer members.

14 Claims, 2 Drawing Sheets

U.S. PATENT DOCUMENTS

| | | | |
|---|---|---|---|
| 3,621,478 A | 11/1971 | Johnson | 333/10 |
| 3,629,733 A | 12/1971 | Podell | 333/10 |
| 3,719,804 A | 3/1973 | Illing | 235/61 |
| 3,869,082 A | 3/1975 | Ludin | 235/61 |
| 3,974,332 A | 8/1976 | Abe et al. | 178/18 |
| 4,139,827 A | 2/1979 | Russell | 333/10 |
| 4,144,485 A | 3/1979 | Akita | 323/44 |
| 4,145,624 A | 3/1979 | Upadhyayula | 307/299 |
| 4,280,119 A | 7/1981 | May | 340/147 |
| 4,480,178 A | 10/1984 | Miller, II et al. | 235/380 |
| 4,553,026 A | 11/1985 | Arlowe | 235/451 |
| 4,633,291 A | 12/1986 | Koyama | 357/51 |
| 4,634,847 A | 1/1987 | Jürgen | 235/451 |
| 4,700,152 A | 10/1987 | Wilson | 333/24 |
| 4,752,680 A | 6/1988 | Larson | 235/492 |
| 4,763,340 A | 8/1988 | Yoneda et al. | 375/121 |
| 4,795,898 A | 1/1989 | Bernstein et al. | 235/487 |
| 4,798,322 A | 1/1989 | Bernstein et al. | 235/487 |
| 4,816,653 A | 3/1989 | Anderl et al. | 235/380 |
| 4,816,654 A | 3/1989 | Anderl et al. | 235/380 |
| 4,818,855 A | 4/1989 | Mongeon et al. | 235/440 |
| 4,835,373 A | 5/1989 | Adams et al. | 235/451 |
| 4,841,128 A | 6/1989 | Gröttrup et al. | 235/491 |
| 4,853,523 A | 8/1989 | Talmadge | 235/492 |
| 4,876,535 A | 10/1989 | Ballmer et al. | 340/825.34 |
| 4,918,416 A | 4/1990 | Walton et al. | 235/497 |
| 4,931,991 A | 6/1990 | Cvijanovich | 365/52 |
| 4,953,123 A | 8/1990 | Takeuchi et al. | 365/66 |
| 5,012,321 A | 4/1991 | Magarshack | 357/71 |
| 5,021,767 A | 6/1991 | Fockens et al. | 340/572 |
| 5,027,191 A | 6/1991 | Bourdelaise et al. | 357/74 |
| 5,047,830 A * | 9/1991 | Grabbe | 357/68 |
| 5,073,761 A | 12/1991 | Waterman et al. | 333/24 C |
| 5,148,263 A | 9/1992 | Hamai | 357/71 |
| 5,159,181 A | 10/1992 | Bartels et al. | 235/441 |
| 5,175,418 A | 12/1992 | Tanaka | 235/439 |
| 5,212,402 A | 5/1993 | Higgins, III | 257/532 |
| 5,229,652 A | 7/1993 | Hough | 307/104 |
| 5,266,821 A | 11/1993 | Chern et al. | 257/312 |
| 5,309,324 A | 5/1994 | Hernandez et al. | 361/734 |
| 5,324,205 A | 6/1994 | Ahmad et al. | 439/66 |
| 5,378,887 A | 1/1995 | Kobayashi | 235/492 |
| 5,435,733 A | 7/1995 | Chernicky et al. | 439/68 |
| 5,451,763 A | 9/1995 | Pickett et al. | 235/492 |
| 5,471,040 A | 11/1995 | May | 235/451 |
| 5,532,658 A | 7/1996 | Tonegawa et al. | 333/246 |
| 5,572,441 A | 11/1996 | Boie | 364/514 |
| 5,579,207 A | 11/1996 | Hayden et al. | 361/790 |
| 5,583,378 A | 12/1996 | Marrs et al. | 257/710 |
| 5,589,709 A | 12/1996 | Dobkin et al. | 257/666 |
| 5,593,322 A | 1/1997 | Swamy et al. | 439/660 |
| 5,594,233 A | 1/1997 | Kenneth et al. | 235/492 |
| 5,598,029 A | 1/1997 | Suzuki | 257/665 |
| 5,598,032 A | 1/1997 | Fidalgo | 257/679 |
| 5,615,477 A * | 4/1997 | Sweitzer | 29/840 |
| 5,629,838 A | 5/1997 | Knight et al. | 361/737 |
| 5,640,306 A * | 6/1997 | Gaumet et al. | 361/737 |
| 5,652,423 A | 7/1997 | Saitoh et al. | 235/492 |
| 5,668,399 A | 9/1997 | Cronin et al. | 257/532 |
| 5,672,911 A | 9/1997 | Patil et al. | 257/691 |
| 5,682,061 A | 10/1997 | Khandros et al. | 257/666 |
| 5,701,032 A | 12/1997 | Fischer et al. | 257/692 |
| 5,701,037 A | 12/1997 | Weber et al. | 257/777 |
| 5,706,174 A | 1/1998 | Distefano et al. | 361/749 |
| 5,714,864 A | 2/1998 | Rose et al. | 320/2 |
| 5,771,157 A | 6/1998 | Zak | 361/760 |
| 5,777,383 A | 7/1998 | Stager et al. | 257/700 |
| 5,786,979 A | 7/1998 | Douglass | 361/328 |
| 5,793,668 A | 8/1998 | Krakovyak | 365/149 |
| 5,804,811 A | 9/1998 | Saitoh et al. | 235/492 |
| 5,810,606 A | 9/1998 | Ballast et al. | |
| 5,818,112 A | 10/1998 | Weber et al. | 257/777 |
| 5,834,832 A | 11/1998 | Kweon et al. | 257/676 |
| 5,841,122 A | 11/1998 | Kirchhoff | 235/492 |
| 5,847,447 A | 12/1998 | Rozin et al. | 257/678 |
| 5,854,480 A | 12/1998 | Noto | 235/492 |
| 5,856,710 A | 1/1999 | Baughman et al. | 307/10.1 |
| 5,929,510 A | 7/1999 | Geller et al. | 257/635 |
| 5,929,517 A | 7/1999 | Distefano et al. | 257/707 |
| 5,936,841 A * | 8/1999 | Kantner et al. | 361/737 |
| 5,936,847 A * | 8/1999 | Kazle | 361/771 |
| 5,938,452 A | 8/1999 | Wojnarowski | 439/67 |
| 5,938,479 A | 8/1999 | Paulson et al. | 439/676 |
| 5,949,060 A | 9/1999 | Schattschneider et al. | 235/492 |
| 5,949,155 A | 9/1999 | Tamura et al. | 307/107 |
| 5,952,709 A | 9/1999 | Kitazawa et al. | 257/664 |
| 5,965,867 A | 10/1999 | Haghiri-Tehrani | 235/492 |
| 5,977,631 A | 11/1999 | Notani | 257/728 |
| 5,977,841 A | 11/1999 | Lee et al. | 333/24 |
| 6,001,211 A | 12/1999 | Hiroyuki | 156/277 |
| 6,005,777 A | 12/1999 | Bloom et al. | 361/766 |
| 6,025,728 A * | 2/2000 | Hembree | 324/755 |
| 6,028,497 A | 2/2000 | Allen et al. | 333/246 |
| 6,049,463 A | 4/2000 | O'Malley et al. | 361/760 |
| 6,057,600 A | 5/2000 | Kitazawa et al. | 257/728 |
| 6,069,404 A | 5/2000 | Aufinger et al. | 257/728 |
| 6,073,855 A | 6/2000 | MacKenthun | 235/492 |
| 6,081,030 A | 6/2000 | Jaouen et al. | 257/728 |
| 6,118,357 A | 9/2000 | Tomasevic et al. | 333/247 |
| 6,124,625 A | 9/2000 | Chern et al. | 257/532 |
| 6,124,636 A | 9/2000 | Kusamitsu | 257/728 |
| 6,145,023 A * | 11/2000 | Iwasaki | 710/13 |
| 6,152,373 A | 11/2000 | Roberts et al. | 235/492 |
| 6,173,897 B1 | 1/2001 | Halpern | 235/488 |
| 6,191,479 B1 | 2/2001 | Herrell et al. | 257/724 |

OTHER PUBLICATIONS

David Salzman, Ph.D., Poly Chip, Inc., Thomas Knight, Jr., Ph.D., Polychip, Inc. and MIT A.I. Lab and Paul Franzon, Ph.D., North Carolina State University, Application of Capacitive Coupling to Switch Fabrics.

J.S. Yuan and J.J. Liou, University of Central Florida, Parasitic Capacitance Effects.

Wally Meinel, Burr Brown Corporation, Platsic Molded Analog Isolation Amplifier.

Paul D. Franzon, Department of Electrical and Computer Engineering, North Carolina State University, Low–Power, High–Performance MEMS–based Switch Fabric.

A.D. Berard, J.J. Pitarra and J. R. Pivnichny, IBM, Jul. 1975, Capacitive Coupled Connector.

G.M. Krembs, IBM. Apr., 1971, Capacitve–Coupled Connectors for Gaseous Discharge Display Panels.

W.T. Pimbley, IBM, Jul. 1975, Magnetic Ink Container for supplying Constant Density Magnetic Ink.

Mitsuru Sekiguchi, Toyokazu Fujii and Michinari Yamanaka, Semiconductor Research Center, Matsuhita Electric Industries, Co, Inc., Feb. 1996, Suppression of Resistance Increase in Annealed Al/W Interconnects by Capacitively Coupled Plasma Nitridation on W Surface.

* cited by examiner

CONTACTLESS INTERCONNECTION SYSTEM

FIELD OF THE INVENTION

This invention generally relates to the art of electrical connections and, particularly, to a contactless interconnecting system between a computer chip package and a circuit board.

BACKGROUND OF THE INVENTION

As semiconductor devices become more complex, the interconnections between the silicon wafer or "die" and appropriate circuit hardware continue to evolve and become more complex because of the difficulty of mechanical interconnections. This is due, in part, to the ever-increasing miniaturization and high density of electronic circuitry. Transmitted signals are becoming faster and faster (i.e., higher frequencies) and semiconductor packages are becoming thinner and thinner (i.e., closely compacted). In some anticipated applications, it may be practically impossible to use conventional interconnecting systems, i.e., typical metal contacts or terminals.

Typical mechanical interconnecting systems incorporate conventional terminal pins and sockets or other male and female configurations or interengaging spring connections. With such traditional metal-to-metal interconnections, it is essential to provide a wiping action between the terminals or contacts to remove contaminants or oxidants. Unfortunately, miniaturized semi-conductor interconnections are so small that such traditional mechanical interconnecting systems are not possible. Even traditional solder connections are difficult if at all possible because of the extremely complex hard tooling required for use with miniaturized or closely spaced components of a semi-conductor interconnecting system. In some applications, it may be necessary to rely on electrical or magnetic field coupling as a possible alternative, and the present invention is directed to satisfying this need and solving the problems enumerated above.

SUMMARY OF THE INVENTION

An object, therefore, of the invention is to provide a new and improved contactless interconnecting system, particularly such a system between a computer chip package and a circuit board.

In the exemplary embodiment of the invention, a computer chip package includes a substantially planar lower surface having a pattern of discrete terminal lands. A circuit board has a substantially planar upper surface spaced from and generally parallel to the lower surface of the chip package. The upper surface of the circuit board has a pattern of discrete circuit pads aligned with the terminal lands on the lower surface of the computer chip package. A plurality of discrete interposer members are provided between the terminal lands and the circuit pads. The interposer members are in a pattern corresponding to and aligned with the aligned pattern of terminal lands and circuit pads. The interposer members are of a material having a relatively high dielectric constant.

As disclosed herein, the terminal lands are on a lower surface of a wall of the computer chip package. The terminal lands are connected by vias through the wall to leads from a silicon wafer of the package.

In one embodiment of the invention, the interposer members are adhered either to the terminal lands or to the circuit pads. In another embodiment of the invention, the interposer members are supported by a planar carrier disposed between the lower surface of the chip package and the upper surface of the circuit board. The planar carrier may be fabricated of dielectric elastomeric material, and the interposer members may be overmolded in the planar carrier member.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENTS

Figure 1:
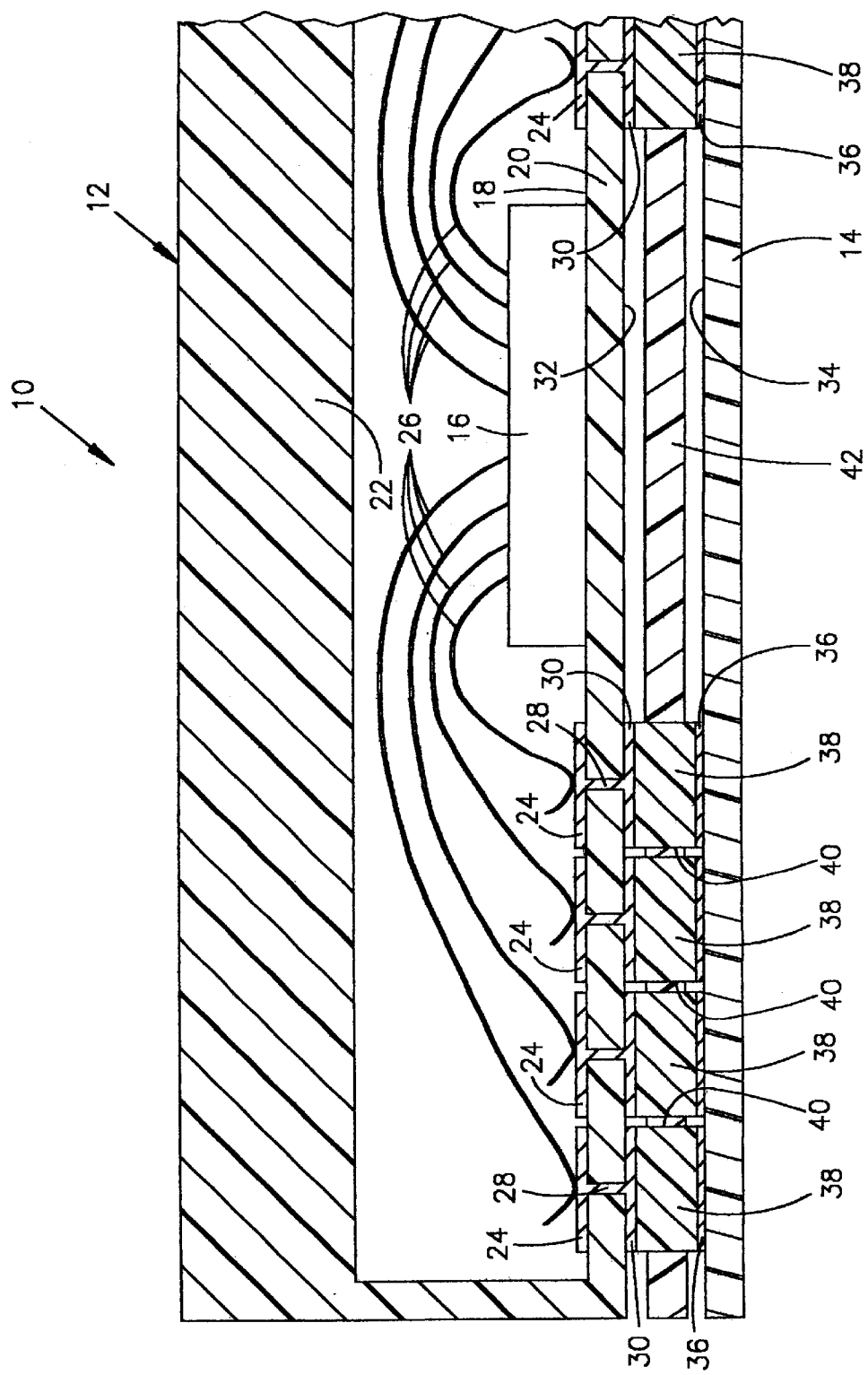
FIG. 1 is a fragmented vertical section through one embodiment of a contactless interconnecting system according to the invention.
Figure 2:
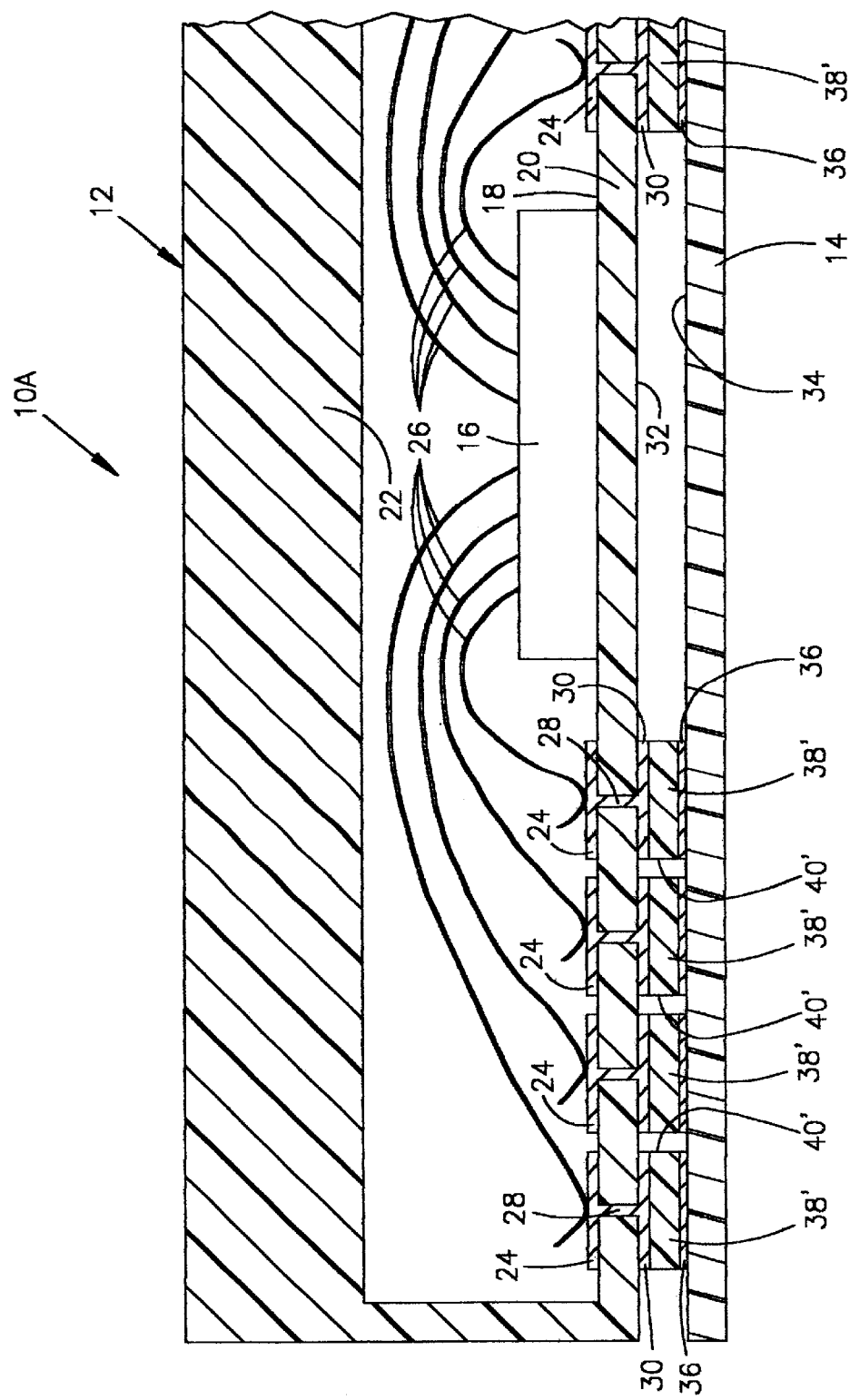
FIG. 2 is a view similar to that of FIG. 1, but of a second embodiment of the invention.

Referring to the drawings in greater detail, FIG. 1 shows a first embodiment of a contactless interconnecting system, generally designated 10, between a computer chip package, generally designated 12, and a circuit board 14 or other substrate, such as a printed circuit board. FIG. 2 shows a second embodiment of a contactless interconnecting system, generally designated 10A, also between chip package 12 and circuit board 14.

Computer chip package 12 in both embodiments 10 and 10A includes a silicon wafer 16 mounted on an upper surface 18 of a wall 20 of a housing 22 within which the silicon wafer is disposed. A pattern of discrete terminal lands 24 are deposited on upper surface 18 of wall 20 and are connected by leads 26 to silicon wafer 16. Terminal lands 24 are connected through wall 18 by respective vias 28 to a matching pattern of discrete terminal lands 30 on a substantially planar lower surface 32 of wall 18 of the chip package.

Circuit board 14 of either interconnecting system 10 or 10A has a substantially planar upper surface 34 spaced from and generally parallel to lower surface 32 of chip package 12. A pattern of discrete circuit pads 36 are disposed on upper surface 34 and are aligned with terminal lands 30 on lower surface 32 of the chip package. The circuit pads 28 are electrically connected to respective circuitry on the circuit board 14.

The invention contemplates that a plurality of discrete interposer members 38 be disposed between terminal lands 30 and circuit pads 36. Interposer members 38 are spaced from each other, as at gaps 40, and are in a pattern corresponding to and aligned with the aligned patterns of terminal lands 30 and circuit pads 36. The interposer members are preferably fabricated of a material having a high dielectric constant relative to the dielectric constant of the material in the gaps 40 to prevent coupling between catercornered terminal lands 30 and circuit pads 36. In an embodiment, the dielectric constant of the interposer members 38 is at least an order of magnitude greater than that of the material in the gaps 40. In another embodiment, the dielectric constant of the interposer members 38 is at least 200. However, as signal frequencies increase the magnitude of the dielectric constant required of the interposer members may decrease.

Interposer members 38 in the embodiment of FIG. 1 are supported by a generally planar carrier member 42 disposed in a parallel arrangement between lower surface 32 of the chip package and upper surface 34 of the circuit board. The planar carrier member may be fabricated of a dielectric elastomeric material, such as plastic or rubber. The interposer members may be overmolded in the planar carrier member. As previously mentioned, the dielectric constant of the interposer members 38 should be an order of magnitude greater than that of the carrier member 42 to prohibit catercornered coupling.

FIG. 2 shows a second or alternative embodiment of the contactless interconnecting system 10A wherein planar carrier member 42 of the first embodiment (FIG. 1) has been eliminated. In this second embodiment of FIG. 2, interposer members 38' are adhered to either or both of terminal lands 30 and circuit pads 36. For example, interposer members may be deposited onto either terminal lands 30 or circuit pads 36 by a suitable printing method. However, gaps 40' again are provided between the interposer members. Once again, the dielectric constant of the interposer members 38' should be an order of magnitude greater than any material (e.g., air) filling the gaps 40' to prevent catercornered coupling.

In both embodiments of the interconnecting systems 10 and 10A shown in FIGS. 1 and 2, respectively, interposer members 38, 38' are discrete members and are separated, as at gaps 40, 40' and described above. Preferably, the interposer members are of sizes substantially the same as the sizes of aligned terminal lands 30 and circuit pads 36. Electrical signals are capacitively transferred from terminal lands 30 through the interposer members 38, 38' to the circuit pads 36. Gaps 40, 40' between the interposer members with a lower dielectric constant than that of the interposer members provide a dielectric break between catercornered terminal lands 30 and circuit pads 36. Since electrical signals prefer to be coupled through high dielectric constant materials, the signals will tend to not cross the gaps 40, 40' between the interposer members of relatively higher dielectric constant materials. Therefore, the discrete or separated interposer members considerably reduce cross-coupling or cross-talk between catercornered sets of terminal lands 30 and circuit pads 36.

It should be understood that the use of such terms as "upper", "lower", "top", "bottom", "vertical" and the like herein and in the claims hereof is not in any way intended to be limiting. Such terms simply provide a clear and concise description and understanding of the invention as viewed in the drawings. Obviously, interconnecting systems 10 and 10A are omni-directional in use or application.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A contactless interconnecting system between a computer chip package and a circuit board, comprising:

a computer chip package having a substantially planar lower surface with a pattern of discrete terminal lands;

a circuit board having a substantially planar upper surface spaced from and generally parallel to the lower surface of the chip package and including a pattern of discrete circuit pads aligned with said terminal lands; and a plurality of individual and discrete, dielectric interposer members extending between said terminal lands and the circuit pads, the interposer members being in a pattern corresponding to and aligned with the aligned patterns of said terminal lands and circuit pads, said interposer members each having a height sufficient to define air gaps between said interposer members.

2. The contactless interconnecting system of claim 1 wherein said terminal lands are on a lower surface of a wall of the computer chip package, the terminal lands being connected by vias through the wall to leads from a silicon wafer of the package.

3. The contactless interconnecting system of claim 1 wherein said interposer members are supported by a planar carrier member disposed between the lower surface of the chip package and the upper surface of the circuit board.

4. The contactless interconnecting system of claim 3 wherein said interposer members are overmolded in the planar carrier member.

5. The contactless interconnecting system of claim 3 wherein said planar carrier member is fabricated of dielectric elastomeric material.

6. The contactless interconnecting system of claim 1 wherein said interposer members are adhered either to said terminal lands or to said circuit pads.

7. The contactless interconnecting system of claim 1 wherein said discrete interposer members are formed of a material having a higher dielectric constant than that of the material filling said gaps.

8. A contactless interconnecting system between a computer chip package and a circuit board, comprising:

a computer chip package having a substantially planar lower surface with a pattern of discrete terminal lands;

a circuit board having a substantially planar upper surface spaced from and generally parallel to the lower surface of the chip package and including a pattern of discrete circuit pads aligned with said terminal lands; and a plurality of discrete, dielectric interposer members supported by a generally planar carrier member disposed between the lower surface of the chip package and the upper surface of the circuit board, the interposer members being in a pattern corresponding to and aligned with the aligned patterns of the terminal lands and circuit pads, and the interposer members being of a material having a higher dielectric constant than that of the planar carrier member.

9. The contactless interconnecting system of claim 8 wherein said terminal lands are on a lower surface of a wall of the computer chip package, the terminal lands being connected by vias through the wall to leads from a silicon wafer of the package.

10. The contactless interconnecting system of claim 8 wherein said interposer members are overmolded on the planar carrier member.

11. The contactless interconnecting system of claim 8 wherein said planar carrier member is fabricated of dielectric elastomeric material.

12. A contactless interconnecting system for a computer chip comprising:

a computer chip package having a substantially planar upper surface spaced from and generally parallel to the lower surface of the chip package and including a pattern of discrete circuit pads aligned with said terminal lands; and a plurality of discrete, dielectric interposer members disposed between the terminal lands and the circuit pads, the interposer members being adhered to one of the terminal lands and the circuit pads, the interposer members having a height sufficient to define gaps therebetween, and the interposer members being of a material having a higher dielectric constant than that of the material filling the gaps.

13. The contactless interconnecting system of claim 12 wherein said terminal lands are on a lower surface of a wall of the computer chip package, the terminal lands being connected by vias through the wall to leads from a silicon wafer of the package.

14. The contactless interconnecting system of claim 12 wherein the dielectric constant of the interposer member is at least ten times greater than the dielectric constant of the material filling the gaps.

* * * * *